(12) United States Patent
Chen et al.

(10) Patent No.: US 7,279,707 B2
(45) Date of Patent: Oct. 9, 2007

(54) TEST KEY STRUCTURE

(75) Inventors: Chuck Chen, Jhubei (TW); Yo-Yi Gong, Hsinchu (TW); Le-Tien Jung, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 240 days.

(21) Appl. No.: 11/066,991

(22) Filed: Feb. 25, 2005

(65) Prior Publication Data

US 2006/0192200 A1 Aug. 31, 2006

(51) Int. Cl.
*H01L 23/58* (2006.01)
(52) U.S. Cl. .......................... 257/48; 324/769
(58) Field of Classification Search ................ 257/48
See application file for complete search history.

(56) References Cited

U.S. PATENT DOCUMENTS 6,350,636 B1 * 2/2002 Lee et al. ................... 438/186
2003/0189204 A1 * 10/2003 Zatelli et al. ................ 257/48

* cited by examiner

*Primary Examiner*—Jerome Jackson
(74) *Attorney, Agent, or Firm*—J.C. Patents

(57) ABSTRACT

A test key structure includes a substrate, a closed loop, a plurality of spacers, a plurality of first and second doping regions and a plurality of contacts. The closed loop having two conductive lines and two connection portions is located on the substrate. Each connection portion connects to one end of the conductive line and surrounds a contact region. The spacers are disposed at the edge of the closed loop to cover the substrate between the conductive lines. The first doping regions are located in the substrate outside the closed loop and the spacers. The second doping regions are located in the substrate under the spacers. The contacts are electrically connected to the first doping regions within the contact regions. Because the spacers and the conductive lines are incorporated into a test key structure, the influence of spacers upon the entire device can be more accurately determined.

15 Claims, 3 Drawing Sheets

TEST KEY STRUCTURE

BACKGROUND OF THE INVENTION

1. Field of the Invention

The present invention relates to a test key structure. More particularly, the present invention relates to a test key structure that tests the influence of spacers upon the entire device.

2. Description of the Related Art

To increase the yield of a product, most semiconductor manufacturers will design test keys in various parts of the device before carrying out a mass production so that any unexpected errors resulting from the fabrication process can be discovered and the faulty part can be dealt with or improved.

FIG. 1 is a top view of a conventional test key structure and FIG. 2 is a cross-sectional view along line II-II of FIG. 1. As shown in FIGS. 1 and 2, the test key structure used for testing a lightly doped drain (LDD) region comprises a substrate 100, a lightly doped drain region 102, a source and a drain region 104 and a plurality of contacts 106a and 106b. In general, a self-aligned silicide block layer 108 is formed over the lightly doped drain region 102. Furthermore, a self-aligned silicide layer 110 is formed over the source and the drain region 104. The lightly doped drain region 102 is disposed between the source and the drain region 104. The contacts 106a and 106b are electrically connected to the source region and the drain region 104 on each side of the lightly doped drain region 102 respectively.

However, as shown in FIGS. 1 and 2, the conventional test key does not incorporate a polysilicon gate and spacers, which are commonly found inside a semiconductor device, into the structural design consideration. Thus, it is difficult to determine the influence of the spacers on the entire device. For example, it is difficult to assess the problem of an out-diffusion of dopants from a lightly doped junction interface due to the heat generated by spacer deposition. With the continuous miniaturization of semiconductor devices, the influence of the spacers can no longer be ignored.

SUMMARY OF THE INVENTION

Accordingly, at least one objective of the present invention is to provide a test key structure to test the influence of spacers upon an entire device.

At least a second objective of the present invention is to provide a test key structure that caters for device miniaturization and has a structure that matches an actual device more closely.

To achieve these and other advantages and in accordance with the purpose of the invention, as embodied and broadly described herein, the invention provides a test key structure. The test key structure comprises a substrate, a closed loop, a plurality of spacers, a plurality of first and second doping regions and a plurality of contacts. The closed loop is located on the substrate. The closed loop has two conductive lines and two connection portions. Each connection portion connects to one end of the conductive line and surrounds a contact region. The spacers are disposed at the edge of the closed loop to cover the substrate between the conductive lines. In addition, the first doping regions are located in the substrate outside the closed loop and the spacers. The second doping regions are located in the substrate under the spacers. The contacts are electrically connected to the first doping regions within the contact regions.

According to a first embodiment of the aforementioned test key structure in the present invention, the first doping region has a dopant concentration greater than the second doping region. Furthermore, the first doping region may include a heavily doped region and the second doping region may include a lightly doped drain (LDD) region. Additionally, each second doping region may include a lightly doped drain (LDD) region and a pocket implant region. The pocket implant region is located between the lightly doped drain region and the substrate.

The present invention also provides an alternative test key structure. The test key structure comprises a substrate, two conductive lines, a plurality of spacers, a plurality of first and second doping regions and a plurality of contacts. The two conductive lines are laid in parallel on the substrate. Each conductive line has a central portion and two end portions. Furthermore, the distance between the central portion of the conductive lines is smaller than the distance between the end portion of the conductive lines. Moreover, the spacers are disposed at the edge of the conductive lines to cover the substrate between the central portion of the conductive lines. The first doping regions are located in the substrate outside the conductive lines and the spacers. The second doping regions are located in the substrate under the spacers. The contacts are electrically connected to the first doping regions between the end portion of the conductive lines.

According to the second embodiment of the aforementioned test key structure in the present invention, the first doping region has a dopant concentration greater than the second doping region. Furthermore, the first doping region may include a heavily doped region and the second doping region may include a lightly doped drain region. Additionally, each second doping region may include a lightly doped drain region and a pocket implant region. The pocket implant region is located between the lightly doped drain region and the substrate.

In the present invention, spacers and conductive lines are incorporated into the test key structure. Hence, the test key has a structure that closely resembles the actual device structure and the influence of the spacer on the entire device can be determined.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
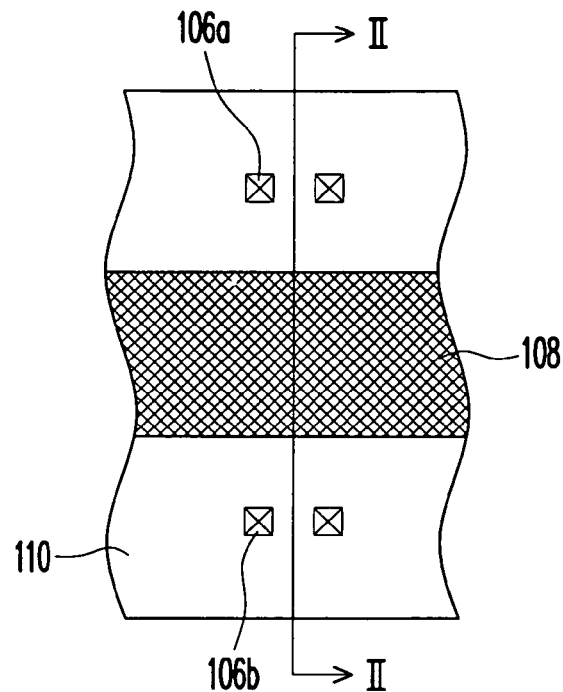
FIG. 1 is a top view of a conventional test key structure.
Figure 2:
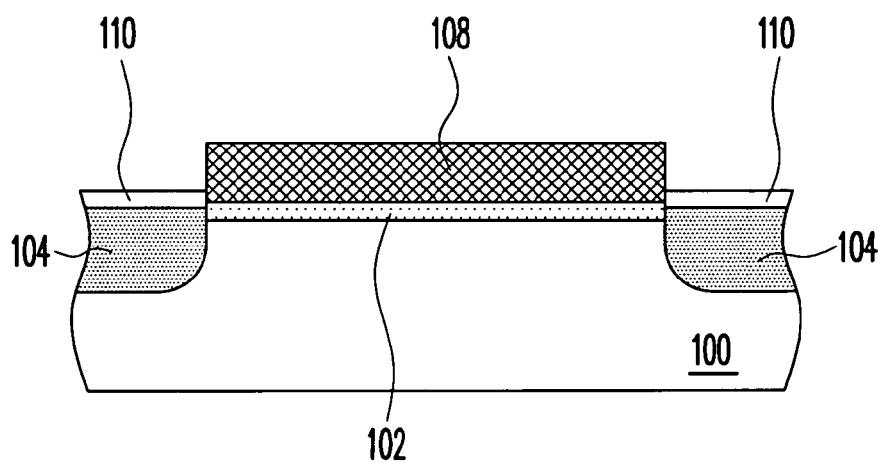
FIG. 2 is a cross-sectional view along line II-II of FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 3:
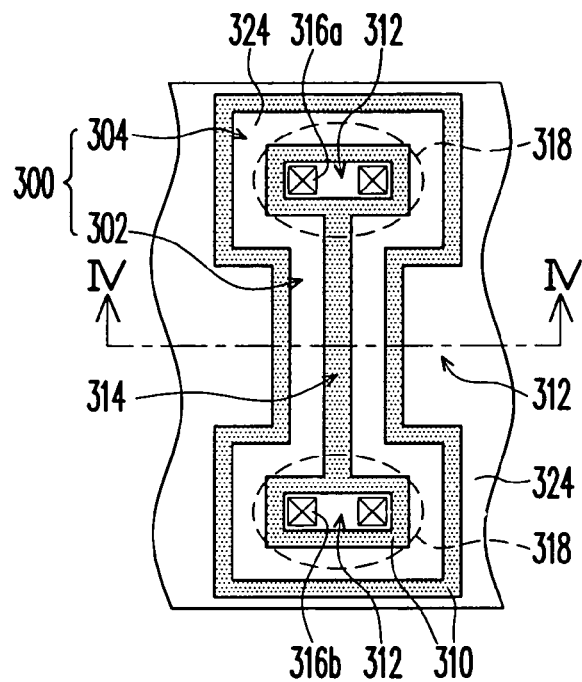
FIG. 3 is a top view of a test key structure according to a first embodiment of the present invention.
Figure 4:
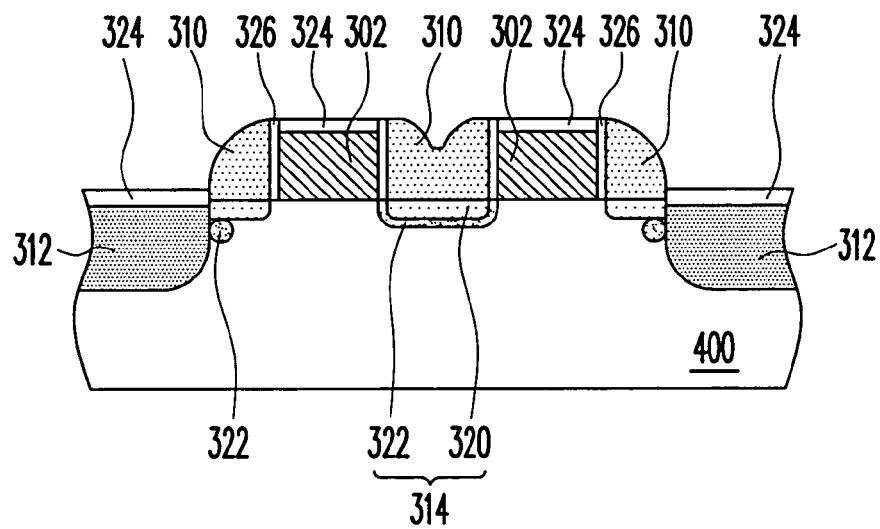
FIG. 4 is a cross-sectional view along line IV-IV of FIG. 3.

FIG. 3 is a top view of a test key structure according to a first embodiment of the present invention. FIG. 4 is a cross-sectional view along line IV-IV of FIG. 3. As shown in FIGS. 3 and 4, the test key structure of the present embodiment comprises a substrate 400, a closed loop 300, a plurality of spacers 310, a plurality of first doping regions 312 and a plurality of second doping regions 314, and a plurality of contacts 316a, 316b. The closed loop 300 is located on the substrate and fabricated from a polysilicon material, for example. The closed loop 300 comprises two conductive lines 302 and two connection portions 304. Each connection portion 304 connects with one end of the conductive line 302 and surrounds a contact region 318. The geometric shape of the closed loop 300 includes a dog-bone shape or other suitable shape. Furthermore, the conductive lines 302 are not limited to a straight line. The conductive lines can be curve or bent lines, for example. The spacers 310 are set up at the edge of the closed loop 300 to cover the substrate between the conductive lines 302. In addition, the first doping regions 312 are disposed in the substrate 400 outside the closed loop 300 and the spacers 310. Meanwhile, the second doping regions 314 are disposed in the substrate 400 under the spacers 310. The contacts 316a, 316b are electrically connected to the first doping region 312 within each contact regions 318.

As shown in FIG. 4, the first doping regions 312 of the test key structure have a dopant concentration greater than the second doping regions 314. In addition, the first doping regions 312 serve as the heavily doped regions of the source and the drain and the second doping regions 314 serve as the lightly doped drain (LDD) regions of the source and the drain, for example. Furthermore, each second doping region 314 may include a lightly doped drain region 320 and a pocket implant region 322. The pocket implant region 322 is normally disposed between the lightly doped drain region 320 and the substrate 400.

In addition, the test key structure in FIGS. 3 and 4 further comprises a silicide layer 324 located on the top surface of the first doping region 312 and the closed loop 300. Furthermore, the test key structure may include a passivation layer 326 between the closed loop 300 and the spacers 310.

To test the test key structure of the present embodiment, one only has to connect the contacts 316a and 316b together. The properties of the second doping region 314 between the conductive lines 302 and under the spacers 310 will be found.

Figure 5:
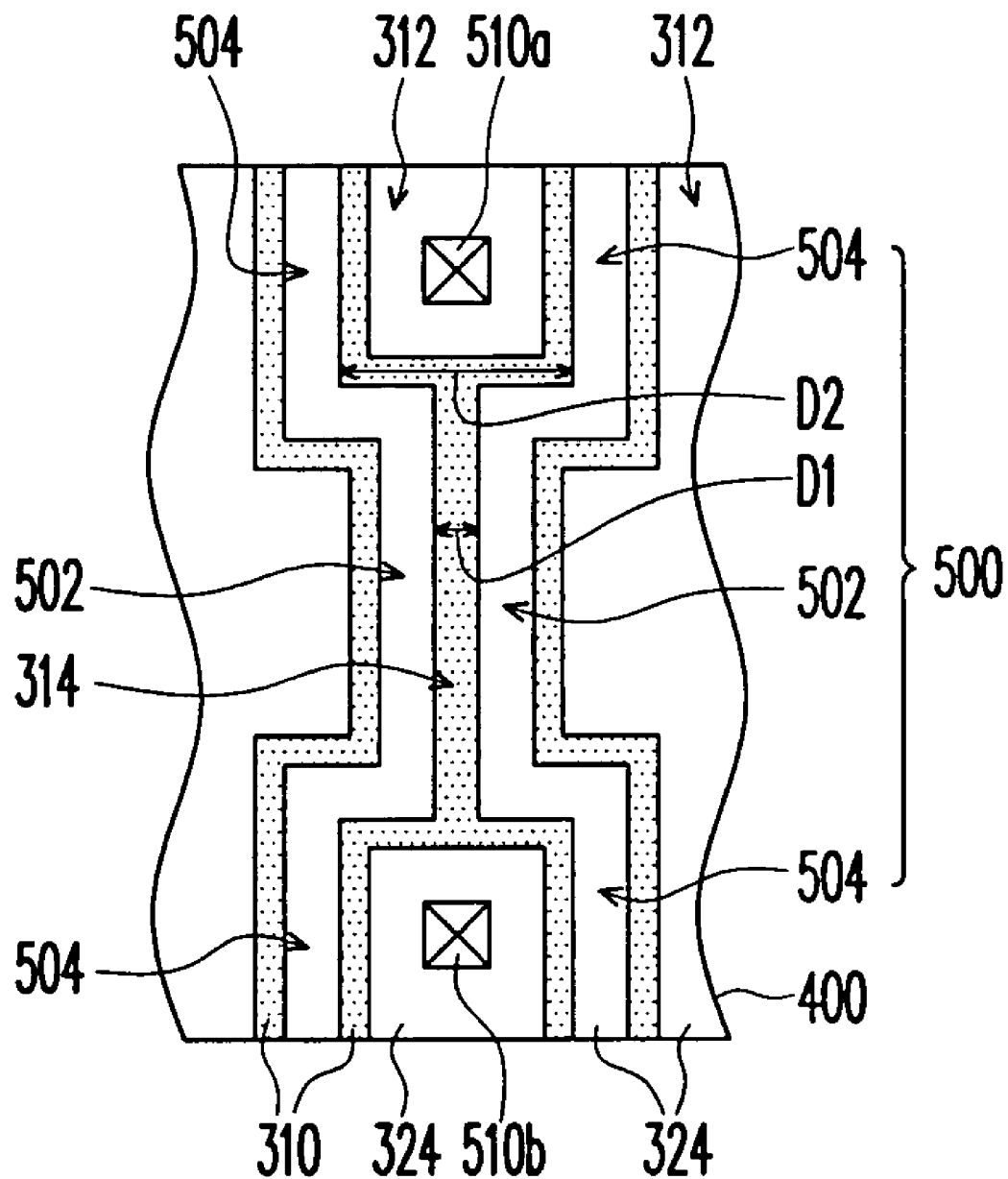
FIG. 5 is a top view of a test key structure according to a second embodiment of the present invention.

FIG. 5 is a top view of a test key structure according to a second embodiment of the present invention. The difference between the second embodiment and the first embodiment is described in detail below. Furthermore, some of the labels used in FIG. 5 are identical to the labels used in the first embodiment because they represent the same components.

As shown in FIG. 5, the test key structure comprises a substrate 400, two conductive lines 500, a plurality of spacers 310, a plurality of first doping regions 312 and a plurality of second doping regions 314, and a plurality of contacts 510a, 510b. The conductive lines 500 are polysilicon layers, for example. The two conductive lines 500 are disposed in parallel on the substrate 400. Each conductive line 500 has a central portion 502 and two end portions 504. Furthermore, the distance D1 separating the central portion 502 of the conductive lines 500 is smaller than distance D2 separating the end portion of the conductive lines 500. The spacers 310 are disposed at the edge of the conductive lines 500 to cover the substrate 400 between the central portions 502. Thus, the shape of the conductive lines 500 is not limited to the one shown in FIG. 5. As long as the distance D1 separating the central portion 502 is sufficiently small so that the spacers 310 can fully cover the substrate 400, it should be considered within the scope of the present invention. The first doping region 312 is disposed in the substrate 400 outside the conductive lines 500 and the spacers 310. The second doping region 314 is disposed in the substrate 400 under the spacers 310. The contacts 510a, 510b are electrically connected to the first doping region 312 between the end portion 504 of the conductive lines 500. Additionally, the top surface of the first doping region 312 and the conductive lines 500 may include a silicide layer 324.

The cross-section view along the central portion 502 of the conductive lines 500 is actually identical to the first embodiment described in FIG. 4. Therefore, the first doping region 312 and the second doping region 314 in the second embodiment can be explained with reference to FIG. 4. For example, the first doping region 312 has a dopant concentration greater than the second doping region 314 or the first doping region 312 is a heavily doped region while the second doping region 314 is a lightly doped drain region. Each second doping region 314 may further comprise a lightly doped drain region 320 and a pocket implant region 322 as shown in FIG. 4. The pocket implant region 322 is located between the lightly doped region 320 and the substrate 400. In addition, the test key structure may further comprise a passivation layer 326 between the conductive lines 500 and the spacers 310.

To test the test key structure of the present embodiment, one only has to connect the contacts 316a and 316b together because the structure shown in FIG. 5 is normally enclosed by an isolation structure. Hence, the properties of the second doping region 314 between the conductive lines 500 will be found.

In summary, spacers and conductive lines are incorporated into the test key structure in the present invention. Hence, the test key has a structure that closely resembles the actual device structure and the influence of the spacer on the entire device can be determined.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A test key structure, comprising:
   a substrate;
   a closed loop disposed on the substrate, wherein the closed loop has two conductive lines and two connection portions, and each connection portion connects with one end of the conductive line and surrounds a contact region;
   a plurality of spacers disposed at an edge of the closed loop to cover the substrate between the conductive lines;
   a plurality of first doping region disposed in the substrate outside the closed loop and the spacers;

a plurality of second doping region disposed in the substrate under the spacers; and a plurality of contacts electrically connected to the respective first doping region within each contact region.

2. The test key structure of claim 1, wherein the first doping region has a dopant concentration greater than the second doping region.

3. The test key structure of claim 1, wherein the first doping region comprises a heavily doped region and the second doping region comprises a lightly doped drain (LDD) region.

4. The test key structure of claim 1, wherein each second doping region comprises a lightly doped drain (LDD) region and a pocket implant region and the pocket implant region is disposed between the lightly doped drain region and the substrate.

5. The test key structure of claim 1, further comprising a silicide layer disposed on a top surface of the first doping region and the closed loop circuit.

6. The test key structure of claim 1, further comprising a passivation layer disposed between the closed loop and the spacers.

7. The test key structure of claim 1, wherein the closed loop comprises a polysilicon layer.

8. The test key structure of claim 1, wherein the closed loop has a dog-bone shape.

9. A test key structure, comprising:

a substrate;

two conductive lines disposed in parallel on the substrate, wherein each conductive line has a central portion and two end portions, and a distance of separation between the central portion of the conductive lines is smaller than a distance of separation between the end portion of the conductive line;

a plurality of spacers disposed at an edge of the conductive lines to cover the substrate between the central portion of the conductive lines;

a plurality of first doping region disposed in the substrate outside the conductive lines and the spacers;

a plurality of second doping region disposed in the substrate under the spacers; and a plurality of contacts electrically connected to the first doping region between the end portion of the conductive lines.

10. The test key structure of claim 9, wherein the first doping region has a dopant concentration greater than the second doping region.

11. The test key structure of claim 9, wherein the first doping region comprises a heavily doped region and the second doping region comprises a lightly doped drain (LDD) region.

12. The test key structure of claim 9, wherein each second doping region comprises a lightly doped drain (LDD) region and a pocket implant region and the pocket implant region is disposed between the lightly doped drain region and the substrate.

13. The test key structure of claim 9, further comprising a silicide layer disposed on a top surface of the first doping region and the conductive lines.

14. The test key structure of claim 9, further comprising a passivation layer disposed between the conductive lines and the spacers.

15. The test key structure of claim 9, wherein the conductive lines comprises polysilicon layers.

* * * * *